(12) United States Patent
Kunce et al.

(10) Patent No.: US 7,755,967 B2
(45) Date of Patent: Jul. 13, 2010

(54) MEMORY DEVICE REFRESH METHOD AND APPARATUS

(75) Inventors: Christopher Kunce, Wake Forest, NC (US); Ding-Cheung Yu, Cary, NC (US)

(73) Assignee: Qimonda North America Corp., Durham, NC (US)

( * ) Notice: Subject to any disclaimer, the term of this patent is extended or adjusted under 35 U.S.C. 154(b) by 99 days.

(21) Appl. No.: 12/240,331

(22) Filed: Sep. 29, 2008

(65) Prior Publication Data

US 2010/0080075 A1    Apr. 1, 2010

(51) Int. Cl.
*G11C 7/00* (2006.01)
(52) U.S. Cl. ................... 365/222; 365/230.03
(58) Field of Classification Search ........... 365/222, 365/230.03, 227
See application file for complete search history.

(56) References Cited

U.S. PATENT DOCUMENTS

| | | | |
|---|---|---|---|
| 5,535,169 A | 7/1996 | Endo | |
| 6,075,744 A | 6/2000 | Tsern | |
| 6,266,292 B1 | 7/2001 | Tsern | |
| 6,343,042 B1 | 1/2002 | Tsern | |
| 6,529,433 B2 * | 3/2003 | Choi | 365/222 |
| 6,590,822 B2 | 7/2003 | Hwang | |
| 6,597,616 B2 | 7/2003 | Tsern | |
| 6,778,458 B2 | 8/2004 | Tsern | |
| 6,819,617 B2 | 11/2004 | Hwang | |
| 6,920,523 B2 | 7/2005 | Le | |
| 6,992,943 B2 | 1/2006 | Hwang | |
| 7,142,475 B2 | 11/2006 | Tsern | |
| 7,313,047 B2 | 12/2007 | Kim | |
| 2002/0191467 A1 * | 12/2002 | Matsumoto et al. | 365/222 |
| 2005/0111282 A1 * | 5/2005 | Dono et al. | 365/222 |
| 2007/0147154 A1 | 6/2007 | Lee | |

OTHER PUBLICATIONS

Daniel, A. "Memory Refresh Method and Apparatus." Co-pending U.S. Appl. No. 11/950,778, filed Dec. 5, 2007.

* cited by examiner

*Primary Examiner*—Vu A Le
(74) *Attorney, Agent, or Firm*—Coats & Bennett, P.L.L.C.

(57) ABSTRACT

In one embodiment, a memory device comprises a plurality of banks and a refresh controller. Each bank is logically divisible into at least two different sections of memory cells during a refresh operation. The refresh controller successively identifies each of the sections using a first portion of a row address and addresses a row of memory cells included in each of the sections using a second portion of the row address. The refresh controller also successively selects two or more different groups of the banks during different time intervals each time a different one of the sections is identified. The refresh controller refreshes the addressed row of memory cells included in the most recently identified section of each bank for the most recently selected group of banks.

25 Claims, 9 Drawing Sheets

MEMORY DEVICE REFRESH METHOD AND APPARATUS

BACKGROUND OF THE INVENTION

Memory devices typically have several independently accessible arrays or 'banks' of memory cells for storing information. A bit of information is written to or read from a particular memory cell by selecting the bank and activating the row and column in the bank at the intersection of which is located the desired memory cell. Information is stored in the activated memory cell by either charging or discharging a capacitor included in the cell. Charge stored on memory cell capacitors leaks out over time, causing data loss if not addressed. To ensure proper data retention, information stored in leaky memory cells is periodically refreshed. Examples of memory devices that suffer from memory cell leakage include Dynamic Random Access Memory (DRAM) devices.

A DRAM device typically performs a refresh operation in response to a refresh command issued to the device. During the refresh operation, normal memory device operation is suspended and one or more rows (also referred to as word lines) of memory cells are refreshed. The refresh operation must be completed within a predetermined amount of time. For example, 256 Mb DDR2 (double-data rate, version 2) DRAM devices must perform a refresh operation in 75 ns or less. 512 Mb DDR2 DRAM devices are allocated 105 ns, 1 Gb DDR2 DRAM devices 127.5 ns, 2 Gb DDR2 DRAM devices 195 ns and 4 Gb DDR2 DRAM devices 327.5 ns.

Current spikes each time a row of memory cells is activated during a refresh operation. To alleviate problematic power supply excursions, even and odd banks are conventionally grouped separately and refreshed at different times. One or more rows of memory cells are refreshed in the even group of banks followed by the same row or rows being refreshed in the odd group of banks. This way, not all rows to be refreshed are activated at the same time. Instead, row activation is spread across even and odd bank groupings during a conventional refresh operation. Additional refresh commands are issued until all rows within the memory device are refreshed within a rolling time interval, e.g., 64 ms.

As memory devices continue to expand in size, so to does the number of word lines requiring periodic refreshing. Yet, the time allocated to perform a refresh operation usually does not scale correspondingly, e.g., as identified above for some types of DDR2 DRAM devices. Otherwise, device performance degrades when refresh operations consume excessive time. Thus, conventional DRAM devices simultaneously refresh multiple word lines per even bank followed by multiple word lines per odd bank to ensure refresh operations are completed within the allocated time. For example, a conventional 1 Gb DRAM device typically refreshes two word lines simultaneously in each even bank followed by two word lines in each odd bank. The number of word lines doubles when the device is scaled to a 2 Gb capacity. Yet, the refresh period allocated to the 2 Gb device does not scale correspondingly. As such, four word lines are conventionally refreshed for each group of banks instead of two word lines, exasperating the current spikes that occur during refresh operations compared to the previous generation. The problem worsens each time the device size increases, requiring more word lines to be simultaneously refreshed.

SUMMARY OF THE INVENTION

In one embodiment, a memory device comprises a plurality of banks and a refresh controller. Each bank is logically divisible into at least two different sections of memory cells during a refresh operation. The refresh controller successively identifies each of the sections using a first portion of a row address and addresses a row of memory cells included in each of the sections using a second portion of the row address. The refresh controller also successively selects two or more different groups of the banks during different time intervals each time a different one of the sections is identified. The refresh controller refreshes the addressed row of memory cells included in the most recently identified section of each bank for the most recently selected group of banks.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
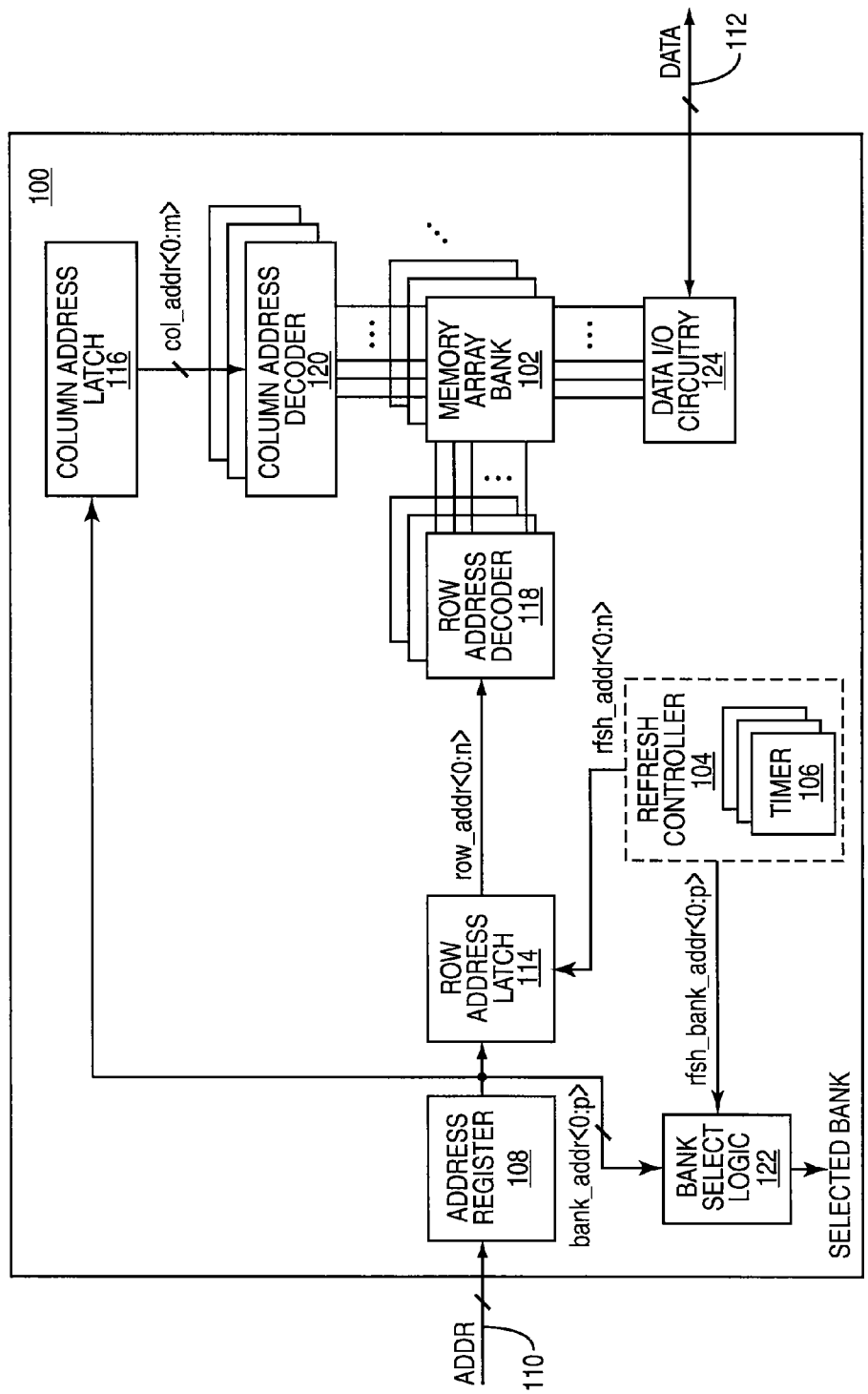
FIG. 1 is a block diagram of an embodiment of a memory device including a refresh controller.

FIG. 1 illustrates an embodiment of a Dynamic Random Access Memory (DRAM) device 100 such as Synchronous DRAM (SDRAM), Double Data Rate (DDR) SDRAM, DDR2 SDRAM, Quad Data Rate (QDR) SDRAM, Synchronous Graphics DRAM, Pseudostatic SDRAM, embedded DRAM or the like. It is to be understood that the embodiments described herein may be applied to any type of memory device that would benefit from a refresh operation. The DRAM device 100 includes a memory array arranged as a plurality of independently accessible banks 102. Each bank 102 has rows of memory cells. A memory cell is accessed by selecting the bank 102 containing the desired cell and activating the row address (row_addr<0:n>) and column address (col_addr<0:m>) at the intersection of which the cell is located. Data can be read from or written to selected memory cells. Rows of memory cells are periodically refreshed so that information stored in the DRAM device 100 is not corrupted.

To this end, the DRAM device includes a refresh controller 104 for performing refresh operations. A refresh operation is performed in response to a refresh command issued to the device 100 such as an auto refresh or self refresh command.

Row refreshing is spread out between groups of banks and within sections of the banks 102. This way, refresh operations can be distributed more evenly across a greater portion of the refresh cycle. Utilizing more of the refresh cycle reduces the magnitude of current spikes that occur during a refresh operation because fewer rows are simultaneously refreshed.

The banks 102 are arranged into two or more groups during refresh operations. The refresh controller 104 logically segments the banks 102 into two or more sections. This way, the banks 102 can be refreshed in a more granular manner. That is, row refreshing can be performed section-by-section within a particular bank 102 instead of just bank-by-bank, allowing the controller 104 to distribute row refreshing more evenly over the refresh cycle. During each refresh operation, the refresh controller 104 successively identifies different ones of the bank sections using a first portion of the row address, e.g., as illustrated by Step 200 of FIG. 2. The first portion of the row address is used to effectively access different sections of the same bank 102 during different time intervals as will be described in more detail later. A second portion of the row address is used to address a row of memory cells included in each bank section as will be described in more detail later, e.g., as illustrated by Step 202 of FIG. 2.

Figure 2:
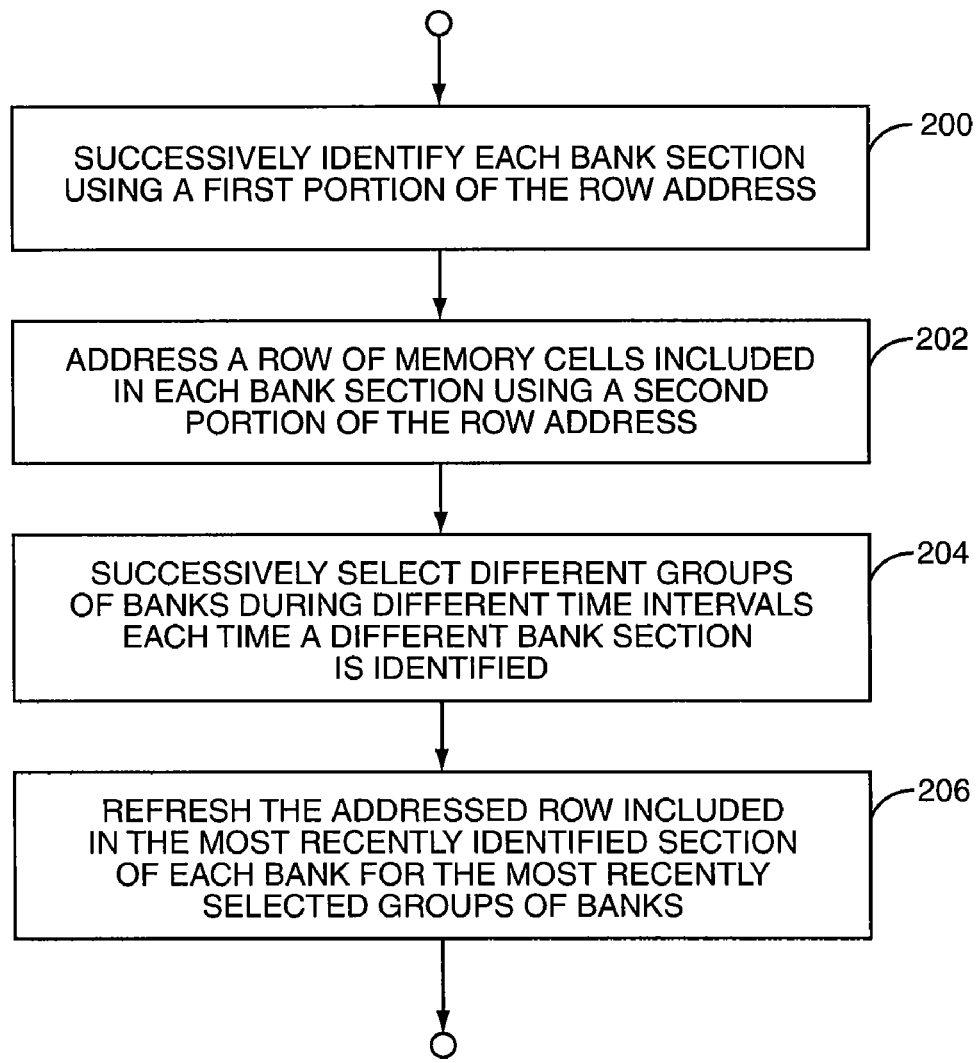
FIG. 2 is a logic flow diagram of an embodiment of program logic for performing a refresh operation.

Different groups of the banks 102 are successively selected during different time intervals each time a different one of the bank sections is identified, e.g., as illustrated by Step 204 of FIG. 2. One or more timer circuits 106 included in or associated with the refresh controller 104 maintain the different time intervals so that the controller 104 can determine when to identify a different bank section, select a different group, and perform row refreshing, respectively. The addressed row included in the most recently identified section of each selected bank 102 is then refreshed, e.g., as illustrated by Step 206 of FIG. 2. The process of identifying different bank sections and selecting different groups of the banks 102 continues until at least one row is refreshed in each bank section, completing the refresh operation. Other rows can be refreshed by issuing subsequent refresh commands. Current spikes occur more frequently during refresh operations, but with a lower magnitude because row refreshing is performed on a more granular level. Simultaneously refreshing fewer rows more often evenly distributes the current spikes over a greater portion of the refresh cycle, reducing problematic power excursions caused by the DRAM device 100 during refresh operations.

In more detail, address information (ADDR) is provided to the DRAM device 100 and stored in an address register 108 during normal operation. The address information indicates the bank, row and column locations to be accessed. In some embodiments, the row and column address information is carried over the same external bus 110 while a separate bus 112 carries data. Accordingly, a row address is provided to the DRAM device 100, followed by a column address. Information written to the DRAM device 100 or read from the device 100 is carried by the data bus 112. In other embodiments, a reduced-pin bus interface (not shown) is used for carrying multiplexed address, data, and control information on the same bus. Regardless, row address information is latched by a row address latch 114 while a column address latch 116 stores column address information. Row and column address decoders 118, 120 determine which memory cells in the selected bank 102 are accessed during a memory operation based on latched row (row_addr<0:n>) and column (col_addr<0:m>) addresses, respectively. Bank select logic 122 determines which bank 102 is selected during normal operation based on the external bank address (bank_addr<0:p>) provided to the memory device 100. Data is then written to or read from the selected memory cells via data Input/Output circuitry 124.

The refresh controller 104 provides refresh row addresses (rfsh_addr<0:n>) to the row address latch 114 during refresh operations. Each refresh row address identifies a particular row to be refreshed. The refresh controller 104 activates the refresh row address bits to select different ones of the rows, the contents of which are then refreshed. The refresh controller 104 also determines when the different banks 102 are selected during refresh operations via a refresh bank address (rfsh_bank_addr<0:p>) provided to the bank select logic 122. Thus, the refresh controller 104 controls which banks 102 are selected at any point of a refresh operation and which bank section is to be refreshed. The refresh controller 104 returns to its initial state after each refresh operation so that the controller 104 is ready to perform subsequent refresh operations.

Figure 3:
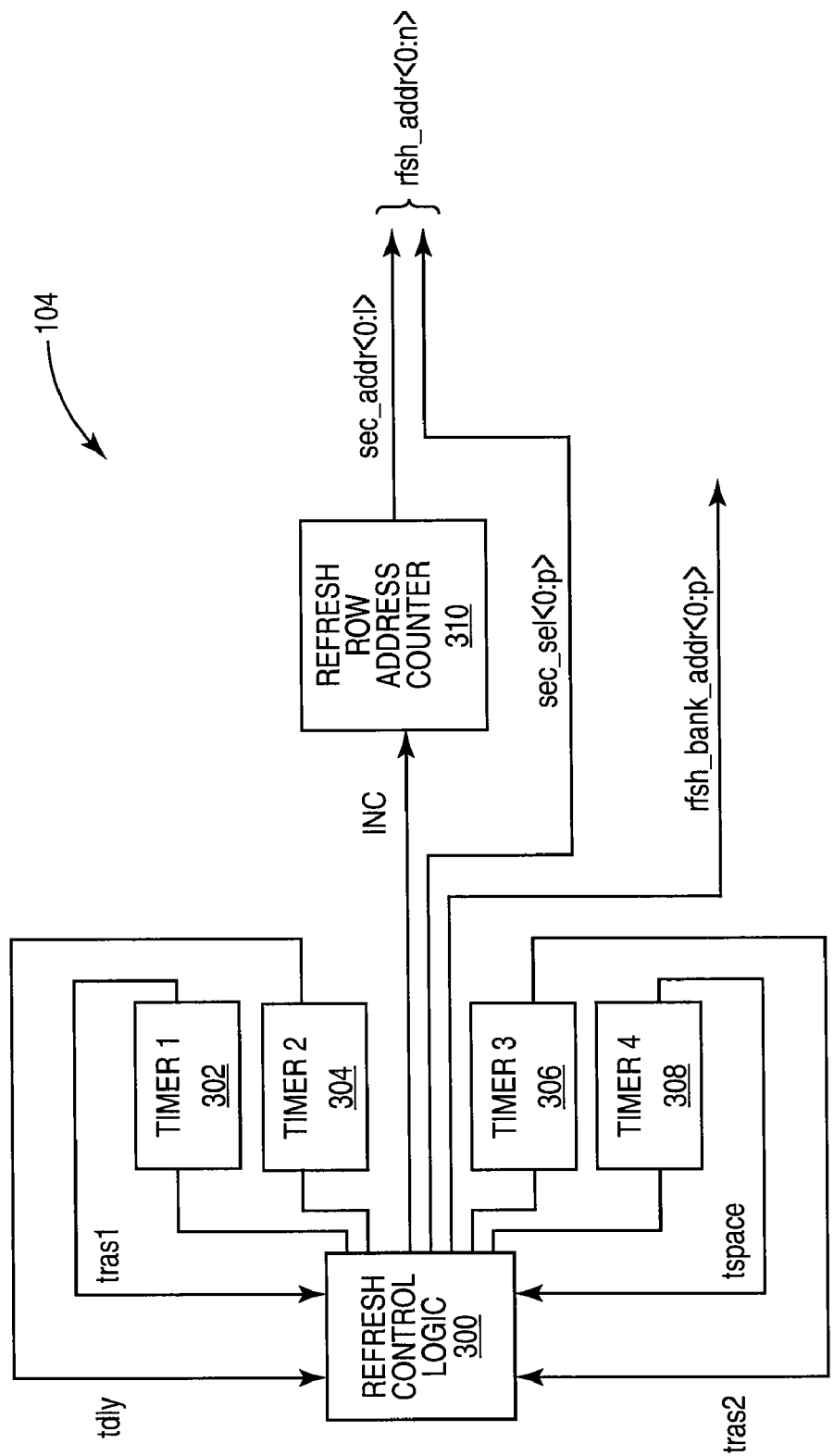
FIG. 3 is a block diagram of an embodiment of a refresh controller included in a memory device.

FIG. 3 illustrates an embodiment of the refresh controller 104. According to this embodiment, the refresh controller 104 includes refresh control logic 300, a plurality of timers 302-308, and a refresh row address counter 310. The row address counter 310 provides the current row address (sec_addr<0:l>) for each bank section. The control logic 300 provides a signal (INC) to the row address counter 310 indicating when the row address is to be incremented. The control logic 300 may activate the row address update signal (INC) at the beginning or end of a refresh operation so that different rows can be refreshed during successive refresh operations.

The control logic 300 also identifies the current bank section and determines which group of the banks 102 is currently selected for row refreshing. The control logic 300 makes these determinations based on the timer outputs. In one embodiment, the control logic 300 is a state machine which changes state based on the timer outputs. One or more of the timer outputs indicate to the control logic 300 when each group of the banks 102 is to be selected and for how long. Based on this information, the control logic 300 determines when to identify a different bank section and when a different group of banks should be selected for row refreshing. In one embodiment, the control logic 300 cycles through each group of the banks 102 until row refreshing is performed in the currently identified section of each bank. The control logic 300 then selects the next bank section and once again cycles through the bank groups. This process continues until row refreshing is performed in all sections of each bank 102. In another embodiment, all bank sections are refreshed for one group of banks before the next bank group is selected. Either way, at least one row of memory cells is refreshed in each section of all banks 102 during a refresh operation.

Figure 4:
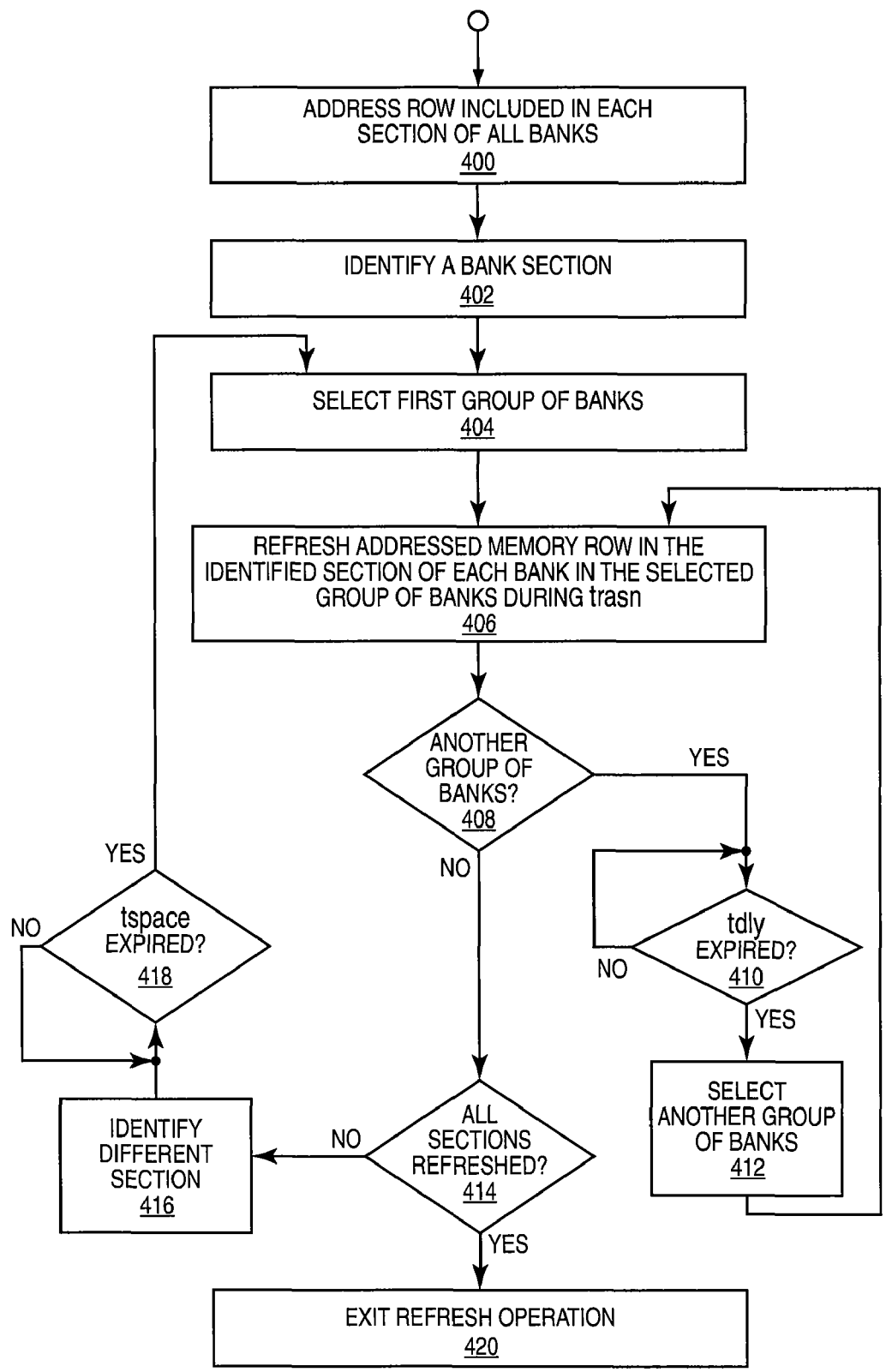
FIG. 4 is a logic flow diagram of another embodiment of program logic for performing a refresh operation.

FIG. 4 illustrates an embodiment of program logic implemented by the control logic 300 during a refresh operation in response to the different timer outputs. The refresh row address counter 310 outputs the current row address (sec_addr<0:l>) for the row or rows to be refreshed in each bank section (Step 400). The control logic 300 identifies which section of each bank 102 is to be refreshed first (Step 402). In one embodiment, one or more of the highest-order bits (sec_sel<0:p>) of the refresh row address (rfsh_addr<0:n>) are used to identify the current bank section. In effect, the control logic 300 uses this portion of the refresh row address to logically segment each bank 102 into two or more sections. A different bank section can be accessed by changing the state of the bank section bit(s). The bits used to identify the current bank section (sec_sel<0:p>) and row address (sec_addr<0:l>) are merged to form the refresh row address (rfsh_addr<0:n>). The row or rows in the current bank section, as indicated by the row address, can then be refreshed.

Figure 5:
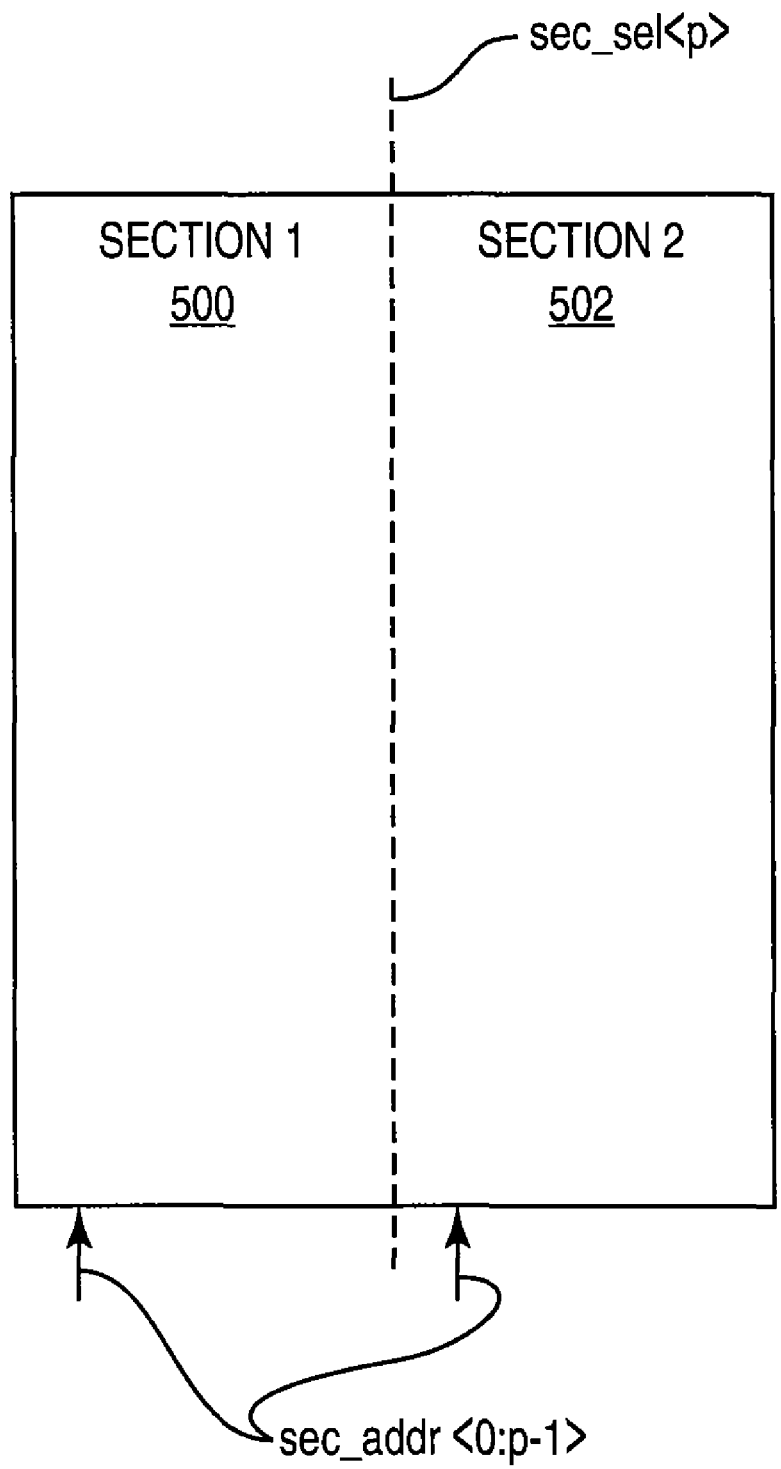
FIG. 5 is a block diagram of an embodiment of a memory bank logically segmented into two sections during refresh operations.
Figure 6:
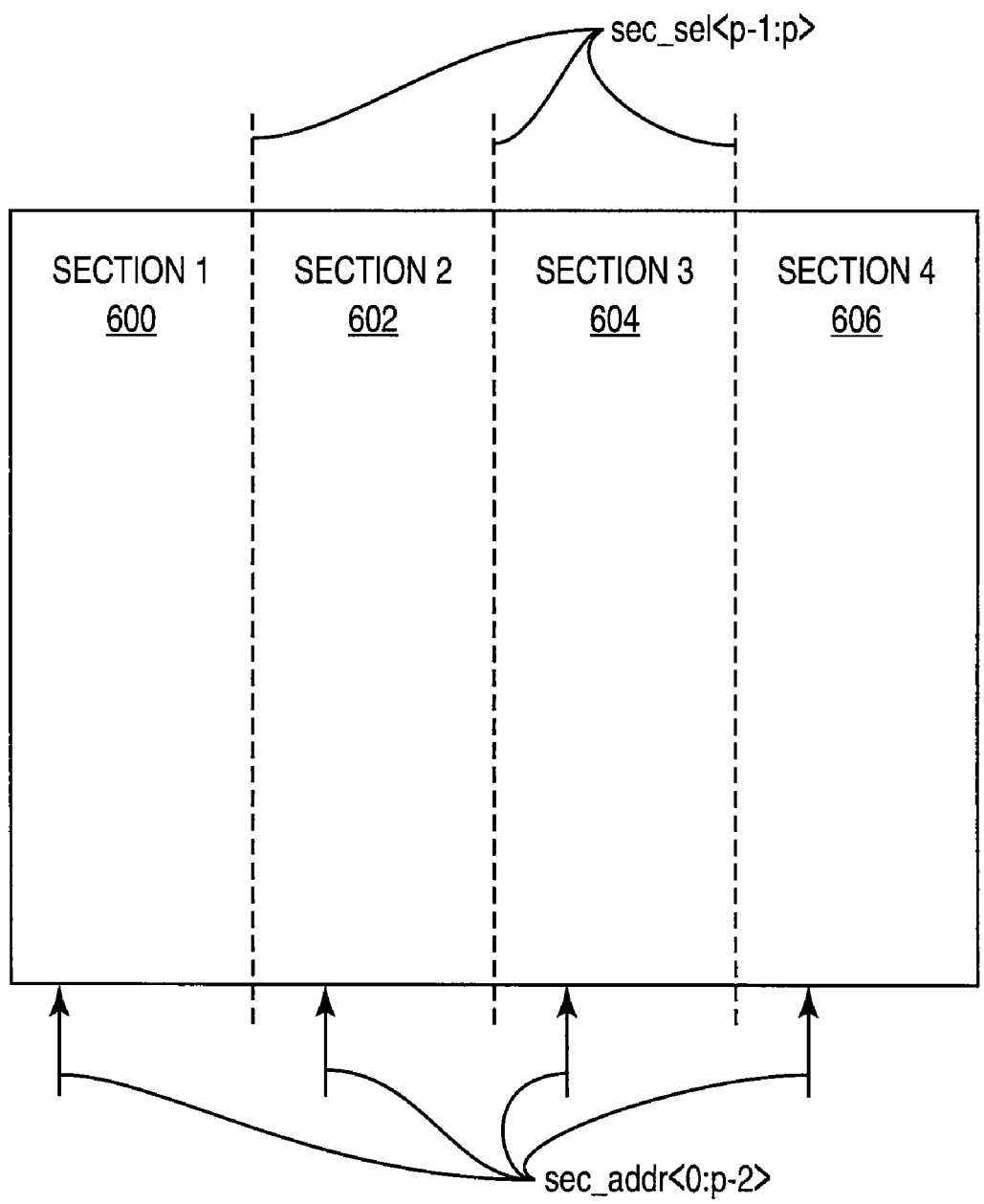
FIG. 6 is a block diagram of an embodiment of a memory bank logically segmented into four sections during refresh operations.

Using the highest-order bits of the refresh row address to identify the current bank section ensures that a row and an adjacent redundant row are not activated at the same time. However, one or more lower-order address bits may be used to identify bank sections. The number of address bits used to identify the current bank section depends on how many logical sections the banks 102 are segmented into. One address bit (sec_sel<p>) is used if the banks 102 are logically segmented into two sections 500, 502 during refresh operations as shown in FIG. 5. The remaining bits of the refresh address (sec_addr<0:p-1>) activate one or more rows in the current bank section 500, 502. Two bits (sec_sel<p-1:p>) are used if the banks 102 are logically segmented into four sections 600-606 during refresh operations as shown in FIG. 6 and so on.

Returning to FIG. 4, the control logic 300 selects the first group of banks for row refreshing by activating the corresponding refresh bank address (rfsh_bank_addr<0:p>) and providing the address to the bank select logic 122 (Step 404). In one embodiment, the banks 102 are arranged into groups of even and odd banks. Broadly, the banks 102 may be arranged in any desirable number of groups. The bank select logic 122 selects the bank(s) 102 indicated by the activated refresh bank address. The selected banks 102 remain active until the first timer 302 expires. During this time interval (tras1), the row or rows activated by the current row address (sec_addr<0:1>) are refreshed in the current section of each selected bank 102 (Step 406). The control logic 300 tracks which group of the banks 102 has been selected and which ones have not (Step 408). The control logic 300 determines that at least one additional group has yet to be selected during the first iteration. The control logic 300 waits to select the second group of banks until the second timer 304 expires (Step 410). During this delay period (tdly), the first group of banks is activated, but not the second group. Upon expiration of the second timer 304, the second bank group is selected (Step 412). The second group of banks remains active until the third timer 306 expires. During this time interval (tras2), the row or rows activated by the current row address (sec_addr<0:1>) are refreshed in the current section of each bank 102 included in the second group (Step 406).

After all groups of the banks 102 have been selected and row refreshing performed for the current bank section, the control logic 300 determines whether all bank sections have been refreshed (Step 414). The control logic 300 identifies the next section of the banks 102 to be refreshed and changes the bank section portion (sec_sel<0:p>) of the refresh address accordingly (Step 416). The control logic 300 re-selects the first group of banks and performs row refreshing in the new bank section (Steps 404-412) after the fourth timer 308 expires (Step 418). During this delay period (tspace), the first bank group cannot be re-selected for performing row refreshing in the new bank section until the last group of banks completes row refreshing in the previous bank section. The refresh operation continues until at least one row of memory cells is refreshed in each section of all the banks 102 (Step 420). In one embodiment, the timers 302-308 included in or associated with the refresh controller 104 are analog timers. In another embodiment, the timers 302-308 are digital. Either way, the different time intervals tracked by the timers 302-308 can be programmed to adjust when current spikes occur during the refresh cycle. In one embodiment, fuse and/or metal mask options are provided for adjusting timer operation. In another embodiment, timer settings may be provided to the memory device 100 for programming the timers 302-308.

Figure 7:
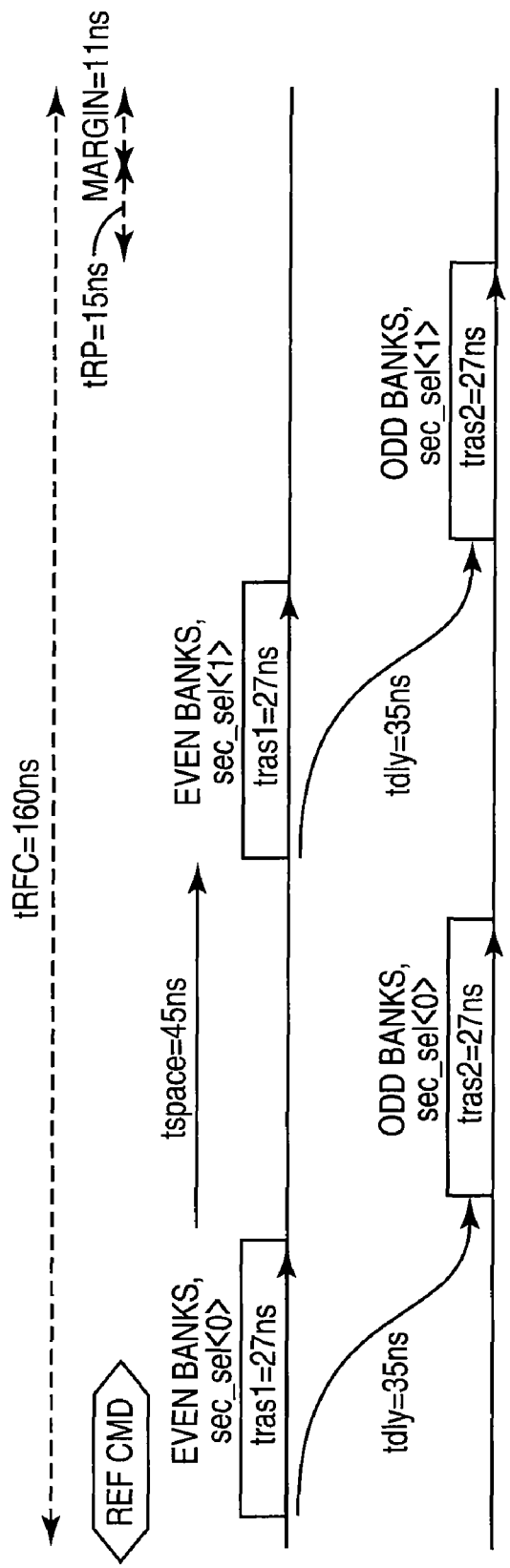
FIG. 7 is a timing diagram illustrating an embodiment of a refresh operation.

Regardless, the different time intervals provided by the timers 302-308 are non-overlapping in one embodiment. This ensures that no two groups of banks 102 are activated during the same time interval. FIG. 7 illustrates a timing diagram of one embodiment where the different time intervals are non-overlapping. For ease of explanation only, the banks 102 are arranged into even and odd groups and each bank 102 has two logical sections 500, 502 as shown in FIG. 5 (sec_sel<p>). A refresh cycle (tRFC) of 160ns is also shown for ease of explanation. However, the banks 102 may be arranged into any number of groups and have any number of logical sections. Moreover, any desirable refresh cycle may be considered. With this understanding, the refresh controller 104 initiates a refresh operation in response to an external refresh command (REF CMD). The even banks 102 are selected first and the first bank section 500 is identified (sec_sel<0>). The first time interval (tras1) expires after approximately 27 ns. During the first time interval, one or more rows are addressed in the identified section of each bank 102 included in the first group and then refreshed. The second timer 304 does not expire until after the first time interval lapses (tdly=35 ns). Thus, the second group of banks is not selected while the first bank group is activated. After the second group is selected, it remains active during the second time interval (tras2) for approximately 27 ns. The first group of banks cannot be re-selected until after the second time interval (tras2) lapses because the corresponding timer delay (tspace) is approximately 45 ns after the first bank group is deactivated. During the second pass, the second bank section 502 is identified (sec_sel<1>) and the refresh process repeated. According to this embodiment, approximately 15 ns remains for bank pre-charging (tRP) which typically is done before resuming normal operation. This leaves approximately 11 ns of margin.

Figure 8:
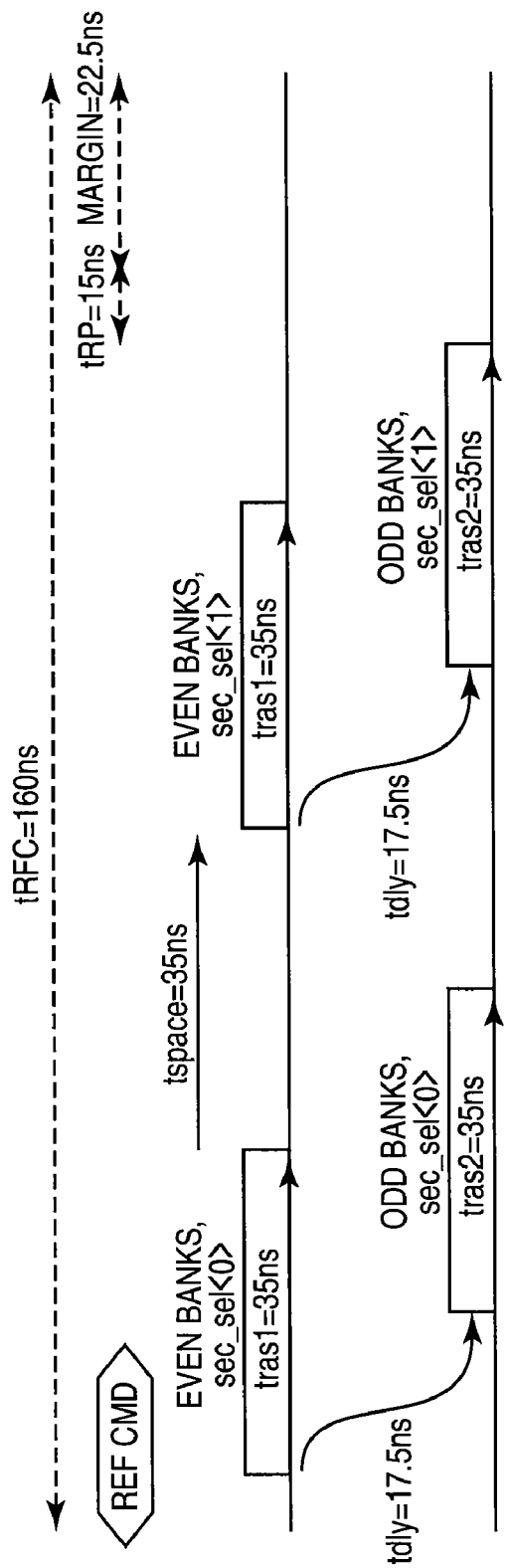
FIG. 8 is a timing diagram illustrating another embodiment of a refresh operation.

In another embodiment, the different time intervals are spaced apart so that row refreshing occurs in the same bank section in at least two groups of banks 102 during partially overlapping time intervals. FIG. 8 illustrates a timing diagram of one embodiment where the different time intervals are partially overlapping. For ease of explanation only, the banks 102 are again arranged into even and odd groups and each bank 102 has two logical sections 500, 502 (sec_sel<p>). A refresh cycle (tRFC) of 160 ns is again chosen for ease of explanation only. However, the banks 102 may be arranged into any number of groups and have any number of logical sections. Moreover, any refresh cycle may be selected. With this understanding, the first time interval (tras1) expires after approximately 35 ns. Yet, the delay incurred before the second group of banks is selected is approximately 17.5 ns (tdly). As such, the second group of banks is selected about halfway into the row refreshing being carried out by the first bank group. This occurs again during the second pass when the second bank section 502 (sec_sel<1>) is refreshed. The timer settings can be adjusted to change when the second group of banks is selected while the first group is activated. According to this embodiment, approximately 15ns of bank pre-charging time (tRP) is preserved with approximately 22.5 ns of margin. As can be seen from these embodiments, the timer settings can be selected and adjusted to space the current spikes that occur when a row is refreshed more evenly across the refresh cycle. Of course, other time intervals are possible and within the scope of the refresh controller teachings disclosed herein.

Figure 9:
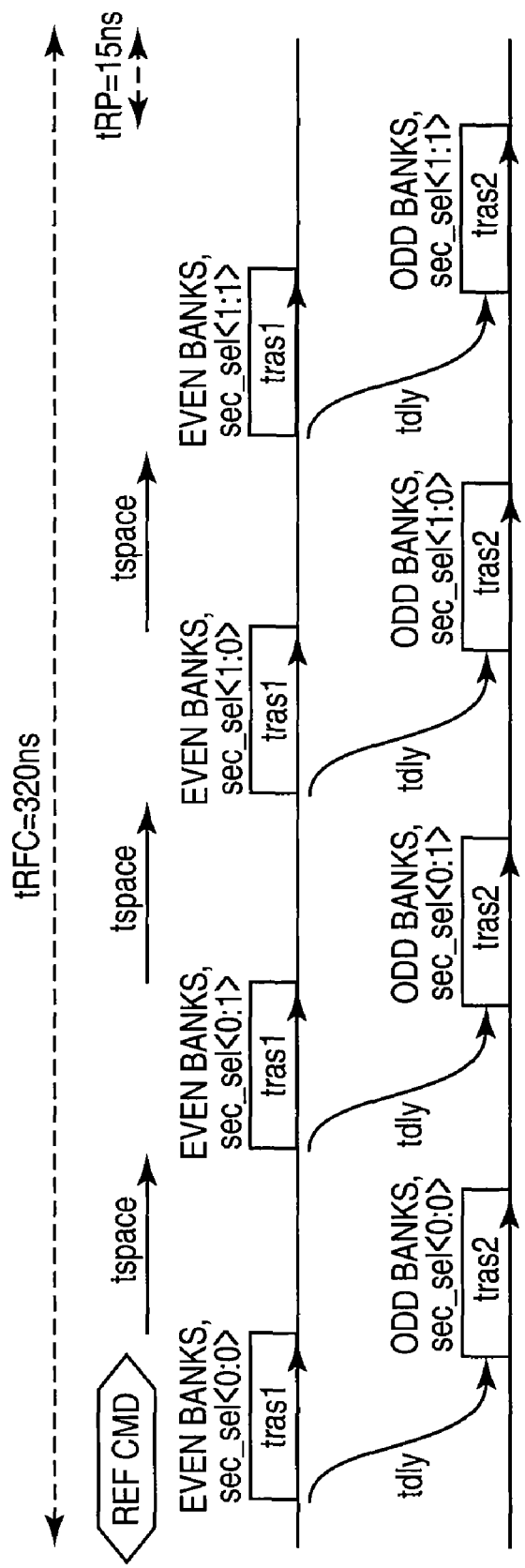
FIG. 9 is a timing diagram illustrating yet another embodiment of a refresh operation.

FIG. 9 illustrates a timing diagram of one embodiment where the banks 102 are arranged into even and odd groups and each bank 102 is logically divided into four sections 600-606 as shown in FIG. 6. Thus, two bits (sec_sel<p-1:p>) of the refresh row address are used to identify the current bank section. The different time intervals (tras1, tras2, tdly and tspace) are selected so that row refreshing in the first and second group of banks partially overlaps. The timer configurations still yield approximately 15 ns of bank pre-charging time (tRP) for a refresh cycle (tRFC) of approximately 320 ns. Again, the timer settings can be selected and adjusted to space the current spikes as desired across the refresh cycle.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of performing a refresh operation by a memory device, comprising:
   selecting a first group of two or more banks of memory cells during a first time interval of the refresh operation;
   refreshing a row of memory cells included in a first section of each bank selected during the first time interval;
   selecting a second group of two or more banks of memory cells during a second time interval of the refresh operation;
   refreshing a row of memory cells included in a first section of each bank selected during the second time interval; and
   successively re-selecting the first and second groups of banks during different, subsequent time intervals of the refresh operation until a row of memory cells included in each remaining section of the memory banks is refreshed during the refresh operation.

2. The method of claim 1, wherein the different time intervals are non-overlapping.

3. The method of claim 1, wherein the different time intervals are spaced apart so that row refreshing occurs in the same section in the first and second groups of banks during partially overlapping time intervals.

4. The method of claim 1, wherein the different time intervals are spaced apart so that row refreshing occurs in different sections in the first and second groups of banks during non-overlapping time intervals.

5. The method of claim 1, further comprising:
   selecting the first group of banks during a first time interval of a subsequent refresh operation;
   refreshing a different row of memory cells included in the first section of each bank selected during the first time interval of the subsequent refresh operation;
   selecting the second group of banks during a second time interval of the subsequent refresh operation;
   refreshing a different row of memory cells included in the first section of each bank selected during the second time interval of the subsequent refresh operation; and
   successively re-selecting the first and second groups of banks during different, subsequent time intervals of the subsequent refresh operation until a row of memory cells included in each remaining section of the memory banks is refreshed during the subsequent refresh operation.

6. A memory device, comprising:
   a plurality of banks each having a plurality of memory cells; and
   a refresh controller operable to:
      select a first group of the banks during a first time interval of a refresh operation;
      refresh a row of memory cells included in a first section of each bank selected during the first time interval;
      select a second group of the banks during a second time interval of the refresh operation;
      refresh a row of memory cells included in a first section of each bank selected during the second time interval; and
      successively re-select the first and second groups of banks during different, subsequent time intervals of the refresh operation until a row of memory cells included in each remaining section of the memory banks is refreshed during the refresh operation.

7. The memory device of claim 6, wherein the different time intervals are non-overlapping.

8. The memory device of claim 6, wherein the different time intervals are spaced apart so that row refreshing occurs in the same section in the first and second groups of banks during partially overlapping time intervals.

9. The memory device of claim 6, wherein the different time intervals are spaced apart so that row refreshing occurs in different sections in the first and second groups of banks during non-overlapping time intervals.

10. The memory device of claim 6, wherein the refresh controller is configured to:
    select the first group of banks during a first time interval of a subsequent refresh operation;
    refresh a different row of memory cells included in the first section of each bank selected during the first time interval of the subsequent refresh operation;
    select the second group of banks during a second time interval of the subsequent refresh operation;
    refresh a different row of memory cells included in the first section of each bank selected during the second time interval of the subsequent refresh operation; and
    successively re-select the first and second groups of banks during different, subsequent time intervals of the subsequent refresh operation until a row of memory cells included in each remaining section of the memory banks is refreshed during the subsequent refresh operation.

11. A method of performing a refresh operation by a memory device having a plurality of banks each being logically divisible into at least two different sections of memory cells during the refresh operation, the method comprising:
    successively identifying each of the sections using a first portion of a row address;
    addressing a row of memory cells included in each of the sections using a second portion of the row address;
    successively selecting two or more different groups of the banks during different time intervals each time a different one of the sections is identified; and
    refreshing the addressed row of memory cells included in the most recently identified section of each bank for the most recently selected group of banks.

12. The method of claim 11, wherein the different time intervals are non-overlapping.

13. The method of claim 11, wherein successively identifying each of the sections using a first portion of a row address comprises changing one or more bits of the row address to identify a different one of the sections each time row refreshing completes in the last group of banks to be selected.

14. The method of claim 13, wherein changing one or more bits of the row address to identify a different one of the sections comprises changing one or more highest-order bits of the row address.

15. The method of claim 11, wherein successively selecting two or more different groups of the banks during different time intervals comprises:
    indicating when a first group of the banks is to be selected and for how long;
    indicating when a second group of the banks is to be selected after the first group of banks is selected;

indicating how long the second group of banks remains selected; and indicating when the first group of the banks can be re-selected.

16. The method of claim 15, further comprising reprogramming one or more of the time intervals.

17. The method of claim 15, further comprising preventing the first group of banks from being re-selected until the second group of banks completes row refreshing for the most recently identified section.

18. A memory device, comprising:
a plurality of banks each being logically divisible into at least two different sections of memory cells during a refresh operation; and
a refresh controller operable to:
successively identify each of the sections using a first portion of a row address;
address a row of memory cells included in each of the sections using a second portion of the row address;
successively select two or more different groups of the banks during different time intervals each time a different one of the sections is identified; and
refresh the addressed row of memory cells included in the most recently identified section of each bank for the most recently selected group of banks.

19. The memory device of claim 18, wherein the different time intervals are non-overlapping.

20. The memory device of claim 18, wherein the refresh controller is operable to change one or more bits of the row address to identify a different one of the sections each time row refreshing completes in the last group of banks to be selected.

21. The memory device of claim 20, wherein the refresh controller is operable to change one or more highest-order bits of the row address to identify a different one of the sections.

22. The memory device of claim 18, wherein the refresh controller comprises:
a first timer operable to indicate when a first group of the banks is to be selected and for how long;
a second timer operable to indicate when a second group of the banks is to be selected after the first group of banks is selected;
a third timer operable to indicate how long the second group of banks remains selected; and
a fourth timer operable to indicate when the first group of the banks can be re-selected.

23. The memory device of claim 22, wherein one or more of the time intervals are reprogrammable.

24. The memory device of claim 22, wherein the refresh controller is operable to prevent the first group of banks from being re-selected until the second group of banks completes row refreshing for the most recently identified section.

25. A memory device, comprising:
a plurality of banks each being logically divisible into at least two different sections of memory cells during a refresh operation; and
means for successively identifying each of the sections using a first portion of a row address, addressing a row of memory cells included in each of the sections using a second portion of the row address, successively selecting two or more different groups of the banks during different time intervals each time a different one of the sections is identified and refreshing the addressed row of memory cells included in the most recently identified section of each bank for the most recently selected group of banks.

* * * * *